(12) United States Patent  (10) Patent No.: US 9,184,298 B2
Morita et al.                (45) Date of Patent:    Nov. 10, 2015

(54) INTERCONNECT STRUCTURE AND SPUTTERING TARGET

(75) Inventors: Shinya Morita, Kobe (JP); Aya Miki, Kobe (JP); Satoshi Yasuno, Kobe (JP); Toshihiro Kugimiya, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 13/991,247

(22) PCT Filed: Dec. 1, 2011

(86) PCT No.: PCT/JP2011/077789
§ 371 (c)(1),
(2), (4) Date: Jun. 3, 2013

(87) PCT Pub. No.: WO2012/074046
PCT Pub. Date: Jun. 7, 2012

(65) Prior Publication Data
US 2013/0248858 A1    Sep. 26, 2013

(30) Foreign Application Priority Data

Dec. 2, 2010 (JP) .................................. 2010-269518
Apr. 14, 2011 (JP) .................................. 2011-090445

(51) Int. Cl.
*H01L 27/14* (2006.01)
*H01L 29/786* (2006.01)
(Continued)

(52) U.S. Cl.
CPC .......... *H01L 29/7869* (2013.01); *C23C 14/086* (2013.01); *C23C 14/14* (2013.01);
(Continued)

(58) Field of Classification Search
CPC ............ H01L 27/1214; H01L 27/1222; H01L 27/1225
USPC ............................................. 257/43, 59, 72
See application file for complete search history.

(56) References Cited

U.S. PATENT DOCUMENTS 8,154,017 B2   4/2012  Yabuta et al.
8,203,143 B2   6/2012  Imai et al.
(Continued)

FOREIGN PATENT DOCUMENTS

JP    2007 73701     3/2007
JP    2007-519256 A  7/2007
(Continued)

OTHER PUBLICATIONS

Nomura, K. et al., "Amorphous Oxide Semiconductors for High-Performance Flexible Thin-Film Transistors", Solid physics, vol. 44, p. 621, (2009) equivalent Japanese article (Japanese Journal of Applied Physics, vol. 45, No. 5B, 2006, pp. 4303-4308) English Translation.

(Continued)

*Primary Examiner* — Tan N Tran
(74) *Attorney, Agent, or Firm* — Oblon, McClelland, Maier & Neustadt, L.L.P.

(57) ABSTRACT

The interconnect structure of the present invention includes at least a gate insulator layer and an oxide semiconductor layer on a substrate, wherein the oxide semiconductor layer is a layered product having a first oxide semiconductor layer containing at least one element (Z group element) selected from the group consisting of In, Ga, Zn and Sn; and a second oxide semiconductor layer containing at least one element (X group element) selected from the group consisting of In, Ga, Zn and Sn and at least one element (Y group element) selected from the group consisting of Al, Si, Ti, Hf, Ta, Ge, W and Ni, and wherein the second oxide semiconductor layer is interposed between the first oxide semiconductor layer and the gate insulator layer. The present invention makes it possible to obtain an interconnect structure having excellent switching characteristics and high stress resistance, and in particular, showing a small variation of threshold voltage before and after the stress tests, and thereby having high stability.

8 Claims, 3 Drawing Sheets

(51) Int. Cl.
*C23C 14/08* (2006.01)
*H01L 21/02* (2006.01)
*C23C 14/14* (2006.01)
*C23C 14/34* (2006.01)

(52) U.S. Cl.
CPC ......... *C23C 14/34* (2013.01); *H01L 21/02554* (2013.01); *H01L 21/02565* (2013.01); *H01L 21/02573* (2013.01); *H01L 21/02581* (2013.01); *H01L 21/02614* (2013.01); *H01L 21/02631* (2013.01); *H01L 29/78693* (2013.01)

(56) References Cited

U.S. PATENT DOCUMENTS

| | | |
|---|---|---|
| 8,212,248 B2 | 7/2012 | Itagaki et al. |
| 8,492,757 B2 | 7/2013 | Sakata et al. |
| 8,502,222 B2 | 8/2013 | Yabuta et al. |
| 2004/0191530 A1 | 9/2004 | Inoue et al. |
| 2009/0197757 A1 | 8/2009 | Fukushima |
| 2009/0211903 A1* | 8/2009 | Lee et al. ............... 204/298.13 |
| 2009/0308635 A1 | 12/2009 | Yano et al. |
| 2009/0321731 A1* | 12/2009 | Jeong et al. .............. 257/43 |
| 2009/0321732 A1 | 12/2009 | Kim et al. |
| 2010/0025674 A1* | 2/2010 | Kim et al. .............. 257/43 |
| 2010/0044703 A1 | 2/2010 | Yabuta et al. |
| 2010/0170696 A1 | 7/2010 | Yano et al. |
| 2010/0276685 A1 | 11/2010 | Itagaki et al. |
| 2011/0121244 A1 | 5/2011 | Yano et al. |
| 2011/0175081 A1* | 7/2011 | Goyal et al. ............. 257/43 |
| 2011/0193083 A1 | 8/2011 | Kim et al. |
| 2012/0037897 A1 | 2/2012 | Shiino et al. |
| 2012/0046021 A1 | 2/2012 | Rao et al. |
| 2012/0119207 A1 | 5/2012 | Goto et al. |
| 2012/0126227 A1 | 5/2012 | Maeda et al. |
| 2013/0009111 A1 | 1/2013 | Morita et al. |
| 2013/0032798 A1 | 2/2013 | Miki et al. |
| 2013/0119324 A1 | 5/2013 | Morita et al. |
| 2013/0181218 A1 | 7/2013 | Maeda et al. |
| 2013/0228926 A1 | 9/2013 | Maeda et al. |
| 2013/0234081 A1 | 9/2013 | Goto et al. |
| 2013/0248858 A1 | 9/2013 | Morita et al. |
| 2013/0299826 A1 | 11/2013 | Sakata et al. |

FOREIGN PATENT DOCUMENTS

| | | | |
|---|---|---|---|
| JP | 2008/199005 A | | 8/2008 |
| JP | 2008 277326 | | 11/2008 |
| JP | 2009 154393 | | 7/2009 |
| JP | 2010-024087 A | | 2/2010 |
| JP | 2010-067954 | | 3/2010 |
| JP | 2010 70410 | | 4/2010 |
| JP | 2010-74061 | * | 4/2010 |
| JP | 2010 74061 | | 4/2010 |
| JP | 2010161327 A | | 7/2010 |
| JP | 2010-232647 | | 10/2010 |
| JP | 2014-168062 A | | 9/2014 |
| KR | 2010-0100636 | | 9/2010 |
| WO | 2009 034953 | | 3/2009 |
| WO | WO 2010/023889 A1 | | 3/2010 |
| WO | WO 2010/032422 A1 | | 3/2010 |
| WO | 2010 119952 | | 10/2010 |

OTHER PUBLICATIONS

Nomura, K. et al., "Room-temperature fabrication of transparent flexible thin-film transistors using amorphous oxide semiconductors", Nature, vol. 432, pp. 488 to 492, (Nov. 25, 2004).

Written Opinion of the International Searching Authority Issued Feb. 21, 2012 in PCT/JP11/077789 filed Dec. 1, 2011 (with English translation).

International Search Report Issued Feb. 21, 2012 in PCT/JP11/77789 filed Dec. 1, 2011.

U.S. Appl. No. 14/399,378, filed Nov. 6, 2014, Goto, et al.

* cited by examiner

INTERCONNECT STRUCTURE AND SPUTTERING TARGET

TECHNICAL FIELD

The present invention relates to an interconnect structure of thin-film transistors (TFTs) to be used in display devices such as liquid crystal displays and organic EL displays; and a sputtering target.

BACKGROUND ART

As compared with widely used amorphous silicon (a-Si), amorphous (non-crystalline) oxide semiconductors have high carrier mobility (also called as field-effect mobility, which may hereinafter be referred to simply as "mobility"), high optical band gaps, and film formability at low temperatures, and therefore, have highly been expected to be applied for next generation displays, which are required to have large sizes, high resolution, and high-speed drives; resin substrates having low heat resistance; and others.

In the oxide semiconductors, amorphous oxide semiconductors consisting of indium, gallium, zinc and oxygen (In—Ga—Zn—O, which may hereinafter be referred to as "IGZO") have preferably been used, in particular, because of their having extremely high carrier mobility. For example, non-patent literature documents 1 and 2 disclose thin-film transistors (TFTs) in which a thin-film of an oxide semiconductor having an In:Ga:Zn ratio equal to 1.1:1.1:0.9 (atomic % ratio) was used as a semiconductor layer (active layer). In addition, patent document 1 discloses an amorphous oxide containing In, Zn, Sn, Ga and other elements, as well as Mo, in which the atomic composition ratio of Mo, relative to the number of all the metal atoms in the amorphous oxide, is from 0.1 to 5 atomic %. Examples of patent document 1 disclose TFTs using an active layer formed by addition of Mo to IGZO.

When an oxide semiconductor is used as a semiconductor layer of a thin-film transistor, the oxide semiconductor is required to have a high carrier concentration (mobility) and excellent TFT switching characteristics (transistor characteristics or TFT characteristics). More specifically, the oxide semiconductor is required to have, for example, (1) a high on-state current (i.e., the maximum drain current when a positive voltage is applied to both a gate electrode and a drain electrode); (2) a low off-state current (i.e., a drain current when a negative voltage is applied to the gate electrode and a positive voltage is applied to the drain voltage, respectively); (3) a low S value (Subthreshold Swing, i.e., a gate voltage needed to increase the drain current by one digit); (4) a stable threshold value (i.e., a voltage at which the drain current starts to flow when a positive voltage is applied to the drain electrode and either a positive voltage or a negative voltage is applied to the gate voltage, which voltage may also be called as a threshold voltage) showing no change with time (which means that the threshold voltage is uniform in the substrate surface); and (5) a high mobility.

Furthermore, TFTs using IGZO or other oxide semiconductor layers are required to have excellent resistance to stress such as voltage application and light irradiation (stress resistance). It is pointed out that, for example, when a voltage is continuously applied to the gate electrode or when light in a blue emitting band in which light absorption starts is continuously irradiated, charges are trapped on the boundary between the gate insulator layer and the semiconductor layer of a thin-film transistor, resulting in a variation of switching characteristics, such as a shift of the threshold voltage. In addition, for example, when a liquid crystal panel is driven or when a negative bias is applied to the gate electrode to turn on a pixel, the TFT is irradiated with light leaked out from the liquid crystal cell, and this light gives stress to the TFT to cause a deterioration in the characteristics. Indeed, when a thin-film transistor is used, a variation of switching characteristics due to stress by voltage application causes a lowering of reliability in a display devices itself, such as a liquid crystal display or an organic EL display. For example, a variation of switching characteristics in an organic EL display creates a need to flow a current of several µA or higher for driving an organic EL element. Therefore, an improvement in the stress resistance (a small variation before and after the stress tests) has eagerly been desired.

The above-described deterioration in the TFT characteristics by stress such as voltage application or light irradiation is due to the formation of defects in the semiconductor itself or on the boundary between the semiconductor and the gate insulator layer during the stress tests. As the gate insulator layer, insulators such as $SiO_2$, $Si_3N_4$, $Al_2O_3$ and $HfO_2$ are widely used in ordinary cases, but the boundary between the semiconductor layer and the insulator layer is an area where different materials come into contact with each other, and therefore, it is considered that defects are particularly liable to be formed. To improve stress resistance, the handling of this boundary between the semiconductor layer and the insulator layer seems to be particularly very important.

To solve the above problems, for example, patent document 2 discloses a method of controlling defects in grain boundaries to improve stability by the use of an amorphous oxide of In-M-Zn (M contains at least one of Ga, Al, Fe, Sn, Mg, Cu, Ge and Si) for a gate insulator layer. However, there is the possibility that the use of a method according to this document causes an increase of defects on the boundary between the gate insulator layer and the semiconductor layer, thereby lowering stability, because the gate insulator layer contains In liable to form oxygen defects.

PRIOR ART DOCUMENTS

Patent Document

Patent Document 1: Japanese Patent Laid-open Publication (Kokai) No. 2009-164393
Patent Document 2: Japanese Patent Laid-open Publication (Kokai) No. 2007-73701

Non-Patent Literature Document

Non-patent Literature Document 1: Solid Physics, Vol. 44, p. 621 (2009)
Non-patent Literature Document 2: Nature, Vol. 432, p. 488 (2004)

SUMMARY OF THE INVENTION

Problems to be Solved by the Invention

The present invention has been completed under the circumstances described above, and one object of the present invention is to provide an interconnect structure with an oxide semiconductor layer, having excellent switching characteristics and high stress resistance, and in particular, showing a small variation of threshold voltage before and after the stress tests, and thereby having high stability.

Another object of the present invention is to provide a sputtering target useful to form the second oxide semiconductor layer included in the interconnect structure described above by a sputtering method.

Means for Solving the Problems

The interconnect structure of the present invention, which was able to solve the problems described above, comprises at least a gate insulator layer and an oxide semiconductor layer on a substrate, wherein the oxide semiconductor layer is a layered product having: a first oxide semiconductor layer containing at least one element (Z group element) selected from the group consisting of In, Ga, Zn and Sn; and a second oxide semiconductor layer containing at least one element (X group element) selected from the group consisting of In, Ga, Zn and Sn, and at least one element (Y group element) selected from the group consisting of Al, Si, Ti, Hf, Ta, Ge, W and Ni, wherein the second oxide semiconductor layer is interposed between the first oxide semiconductor layer and the gate insulator layer.

When the present invention is put into practice, the total content of the Y group element, relative to the total content of all the metals contained in the second oxide semiconductor layer, may preferably be from 0.5 to 8.0 atomic %. It is also a preferred embodiment that the second oxide semiconductor layer may have a thickness of from 0.5 to 10 nm.

It is also a preferred embodiment of the present invention that the kind of the X group element and the ratio of the X group element among the respective elements contained in the second oxide semiconductor layer may be the same as the kind of the Z group element and the ratio of the Z group element among the respective elements contained in the first oxide semiconductor layer, respectively.

Furthermore, in an embodiment of the present invention, the first oxide semiconductor layer may preferably have a thickness of from 10 to 200 nm.

Furthermore, the second oxide semiconductor layer may preferably contain at least one kind of the Y group element selected from the group consisting of Si, Hf and Ni.

The oxide semiconductor layer may preferably have a density of 5.8 g/cm$^3$ or higher.

For forming the second oxide semiconductor layer of the present invention, a sputtering target can preferably be used, which comprises: at least one element (X group element) selected from the group consisting of In, Ga, Zn and Sn; and at least one element (Y group element) selected from the group consisting of Al, Si, Ti, Hf, Ta, Ge, W and Ni. In this case, it is also a preferred embodiment that the Y group element may be at least one selected from the group consisting of Si, Hf and Ni.

Effects of the Invention

The interconnect structure of the present invention has excellent switching characteristics and high stress resistance, and in particular, shows a small variation of threshold voltage before and after the stress tests, and therefore, interconnect structures were able to be provided, which have excellent TFT characteristics and high stress resistance.

In addition, the sputtering target of the present invention makes it possible to easily provide the second oxide semiconductor layer included in the interconnect structure described above.

MODE FOR CARRYING OUT THE INVENTION

Figure 1:
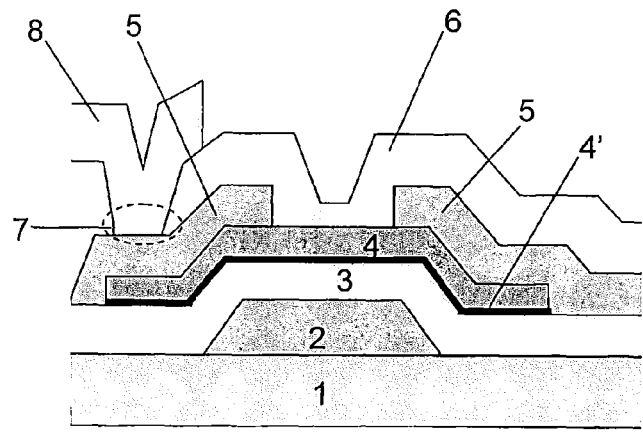
FIG. 1 is a schematic cross-sectional view for the explanation of a thin-film transistor with a layered product of the first oxide semiconductor layer and the second oxide semiconductor layer as the oxide semiconductor layer to be used in the present invention.

The present inventors have made various studies to improve TFT characteristics and stress resistance when an oxide containing at least one element (which may hereinafter be referred to as the Z group element) selected from the group consisting of In, Ga, Zn and Sn is used for the active layer (the first oxide semiconductor layer) of TFTs. As a result, they have found that an intended object can be achieved by the interposition of an oxide semiconductor layer (the second oxide semiconductor layer) containing at least one element (which may hereinafter be referred to as the X group element) selected from the group consisting of In, Ga, Zn and Sn, and at least one element (which may hereinafter be referred to as the Y group element) selected from the group consisting of Al, Si, Ti, Hf, Ta, Ge, W and Ni between the first oxide semiconductor layer and the gate insulator layer, thereby completing the present invention.

More specifically, TFTs each having the second oxide semiconductor layer containing the X group element and the Y group element between the gate insulator layer and the first oxide semiconductor layer was found to have excellent TFT characteristics and high stress resistance as compared with the case where Mo disclosed in patent document 1 or any element other than the Y group element.

The first oxide semiconductor layer to be used in the present invention is not particularly limited, so long as it is an oxide semiconductor layer to be used in display devices, but publicly known oxide semiconductor layers can be used as the first oxide semiconductor layer. The present invention is characterized in that the second oxide semiconductor layer has a specific composition, in addition to the disposition of the second oxide semiconductor layer between the first oxide semiconductor layer and the gate insulator layer.

First, the following will explain the metals (the Z group elements: In, Ga, Zn and/or Sn) as the base material forming the first oxide semiconductor layer in the present invention.

In the oxide semiconductors, amorphous oxide semiconductors containing at least one element selected from the group consisting of In, Ga, Zn and Sn have high carrier mobility, large optical band gaps, and film formability at low temperatures, as compared with widely used amorphous silicon (a-Si). The Z group elements described above may be used alone, or two or more kinds thereof may be used in combination.

Regarding the metals described above (In, Ga, Zn and/or Sn), the ratio of these metals is not particularly limited, so long as oxides containing at least one of these metals have an amorphous phase and fall within the category of showing semiconductor characteristics.

More specifically, regarding Zn, the ratio of Zn among all the metals (In, Ga, Zn and/or Sn) may preferably be 80 atomic % or lower. When the ratio of Zn is higher than 80 atomic %, the oxide semiconductor film may undergo crystallization to form grain-boundary trap levels, thereby causing adverse effects in the transistor production, such as a lowering of carrier mobility and a difficulty in the processing by wet etching. More preferably, the ratio of Zn may be 70 atomic % or lower. On the other hand, the ratio of Zn among all the metals may preferably be 20 atomic % or higher, more preferably 30 atomic % or higher, taking into consideration the condition that the first oxide semiconductor layer is made to have an amorphous structure.

The above metals (In, Ga and/or Sn) other than Zn may appropriately be controlled so that Zn is controlled in the range described above and the ratio (atomic % ratio) of respective metal elements falls within the range described below. More specifically, the preferred ratio of In among all the metals may approximately be from 10 atomic % to 70 atomic %, more preferably be 25 atomic % or higher. The preferred ratio of Ga among all the metals may approximately be from 25 atomic % to 70 atomic %, and the preferred ratio of Sn among all the metals may be 50 atomic % or lower.

Figure 2:
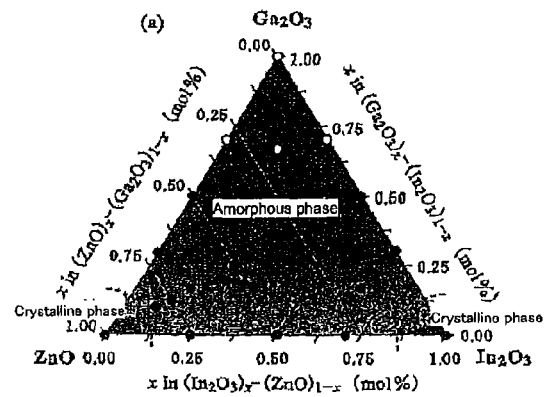
FIG. 2 is a diagram showing the composition of IGZO in amorphous phase.

As the oxide semiconductor containing the above metals (In, Ga, Zn and/or Sn), there can be mentioned, for example, In—Ga—Zn—O, Zn—Sn—O and In—Zn—Sn—O. For example, in the case of In—Ga—Zn—O, the ratios of respective metals capable of forming amorphous phase (more specifically, respective molar ratios of InO, GaO and ZnO) are disclosed in non-patent literature document 1 described above. For In—Ga—Zn—O, when the ratios of respective metals are considerably outside the ranges providing amorphous phase as shown in FIG. 2 and the ratios of ZnO and $In_2O_3$ extremely rise to form crystalline phase, various problems may occur, such as a difficulty in the processing by wet etching and no observation of transistor characteristics.

As a typical composition of In—Ga—Zn—O, there can be mentioned, for example, those which have an In:Ga:Zn ratio (atomic % ratio) of from 2:2:1 to 1:1:1. Besides, there can also be mentioned, for example, Zn—Sn—O (Zn:Sn=from 2:1 to 1:1) and In—Zn—Sn—O (In:Zn:Sn=1:2:1).

As described above, the most distinctive feature of the present invention is that the second oxide semiconductor layer containing the Y group element useful for an improvement in the TFT characteristics and stress resistance, in addition to the X group element, is interposed between the gate insulator layer and the first oxide semiconductor layer. Similarly to the first oxide semiconductor layer, the second oxide semiconductor layer may also be desired to have high carrier mobility, large optical band gaps and film formability at low temperatures, and therefore, the X group element as the main element contained in the second oxide semiconductor layer is required to be at least one element selected from the group consisting of In, Ga, Zn and Sn. In addition, the ratio among the respective metal elements (the X group elements: In, Ga, Zn and/or Sn) as the base material components forming the second oxide semiconductor layer of the present invention is not particularly limited, so long as it is in the range where an oxide containing at least one of these metals has amorphous phase and shows semiconductor characteristics, similarly to the above first oxide semiconductor layer (the Z group element), but can appropriately be set to be within the same range as in the case of the Z group element.

The oxide semiconductor layer of the present invention is a layered product of the first oxide semiconductor layer and the second oxide semiconductor layer, and the first oxide semiconductor layer and the second oxide semiconductor layer have a unified semiconductor function. It is, therefore, desired from the viewpoint of ensuring reliability that the first oxide semiconductor layer and the second oxide semiconductor layer have the same semiconductor characteristics such as carrier mobility and optical band gaps. Accordingly, the kind of the X group element and the ratio of the X group element among the respective elements contained in the second oxide semiconductor layer may desirably be the same as the kind of the Z group element and the ratio of the Z group element among the respective elements contained in the first oxide semiconductor layer.

The second oxide semiconductor layer in the present invention contains at least one element (the X group element) selected from the group consisting of In, Ga, Zn and Sn, and at least one element (the Y group element) selected from the group consisting of Al, Si, Ti, Hf, Ta, Ge, W and Ni. The X group elements may be added alone, or two or more kinds thereof may be used in combination. The Z group elements may be added alone, or two or more kinds thereof may be used in combination.

In the present invention, transistor characteristics such as mobility and stress resistance can be improved by the disposition of the second oxide semiconductor layer between the first oxide semiconductor layer and the gate insulator layer. It is assumed that the disposition of the second oxide semiconductor layer on the boundary between the first oxide semiconductor layer and the gate insulator layer has the effect of reducing defects on the boundary and making the structure stabilized.

In other words, since the Z group element (In, Ga, Zn and/or Sn) contained in the first oxide semiconductor layer has weak bonding to oxygen, when the first oxide semiconductor layer is formed so as to come in direct contact with the gate insulator layer, trap levels may easily be formed by oxygen defects on the boundary between the gate insulator layer and the first oxide semiconductor layer. Such trap levels are responsible for a lowering of the mobility and stability of thin-film transistors.

Thus, in the present invention, the density of defects on the boundary between the gate insulator layer and the first oxide semiconductor layer is reduced by the disposition of the second oxide semiconductor layer containing at least one element (the Y group element) that can form a stable oxide on the boundary between the first oxide semiconductor layer and the gate insulator layer. Elements that may lower the bulk mobility and carrier density of the semiconductor layer or significantly deteriorate thin-film transistor characteristics cannot be used, even if these elements can form a stable oxide as described above. The present inventors' experiments found that switching characteristics cannot be exhibited by the addition of, for example, Mn or Cu, even at 1 atomic %, to the second oxide semiconductor layer, and therefore, these elements are not suitable for the Y group element. In Examples described below, the results are shown for reference, which were obtained in the cases where Mn or Cu was added at 2.2 atomic % or 2.5 atomic %, respectively, relative to the total amount of all the metals contained in the second oxide semiconductor layer.

In the present invention, as the Y group element, there can be used at least one element selected from the group consisting of Al, Si, Ti, Hf, Ta, Ge, W and Ni. These elements have smaller oxide formation free energy than that of In, Ga, Sn or Zn, and strongly bind to oxygen, and form a stable oxide; and in addition, these elements are effective for an improvement in the stability without substantially lowering mobility, even if added in the range (from 0.5 to 8.0 atomic %) preferred in the present invention. These elements may be added alone, or two or more kinds thereof may be used in combination. Preferred is at least one selected from the group consisting of Al, Si, Hf, Ta and Ni, and more preferred is at least one selected from the group consisting of Si, Hf and Ni.

The preferred ratio ([Y group element/(X group element+Y group element)]) of the total Y group element content to the total content of all the metals (the X group element and the Y group element) contained in the second oxide semiconductor layer may be determined with consideration for carrier density, semiconductor stability and other characteristics. The ratio of the total Y group element content (the ratio means a single ratio if the Y group element is contained alone, or a total ratio if two or more kinds of the Y group elements are contained) may preferably be 0.5 atomic % or higher, because the effect of suppressing the formation of oxygen defects cannot sufficiently be obtained when the total Y group element content is too low. On the other hand, the ratio of the total Y group element content may preferably be 8.0 atomic % or lower, more preferably 7.5 atomic % or lower, still more preferably 5.0 atomic % or lower, and further still more preferably 3.0 atomic % or lower, because the carrier density in the semiconductor is lowered, resulting in a decrease of the on-state current, when the total Y group element content is too high.

As the preferred composition of the second oxide semiconductor layer described above, there can be mentioned, for example, the following:

(A) In—Ga—Zn—X group element-O (wherein preferred as the X group element is Si, Hf and/or Ni). As the preferred ratio (atomic % ratio) of In, Ga and Zn in the metal elements (In, Ga and Zn) except the X group element, for example, In:Ga:Zn=from 2:2:1 to 1:1:1.

(B) Zn—Sn—X group element-O (wherein preferred as the X group element is Si, Hf and/or Ni). As the preferred ratio (atomic % ratio) of Zn and Sn in the metal elements (Zn and Sn) except the X group element, for example, Zn:Sn=from 2:1 to 1:1.

(C) In—Zn—Sn—X group element-O (wherein preferred as the X group element is Si, Hf and/or Ni). As the preferred ratio (atomic % ratio) of In, Zn and Sn in the metal elements (In, Zn and Sn) except the X group element, for example, In:Zn:Sn=1:2:1.

The thickness of the first oxide semiconductor layer contained in the oxide semiconductor layer of the present invention is not particularly limited, but it may preferably be 10 nm or larger, more preferably 30 nm or larger, because there is fear that the characteristics in the substrate surface (TFT characteristics such as mobility, S value and $V_{th}$) may vary when the first oxide semiconductor layer has a too small thickness. On the other hand, the first oxide semiconductor layer may preferably have a thickness of 200 nm or smaller, more preferably 80 nm or smaller, because film formation may require much time to cause an increase in the production cost when the first oxide semiconductor layer has a too large thickness.

Furthermore, the thickness of the second oxide semiconductor layer may also not particularly be limited, but may preferably be 0.5 nm or larger, more preferably 1 nm or larger, because the formation of the second oxide semiconductor layer may have no sufficient effect when the second oxide semiconductor layer has a too small thickness. On the other hand, the second oxide semiconductor layer may preferably have a thickness of 10 nm or smaller, more preferably 5 nm or smaller, because there is fear that mobility may be lowered when the second oxide semiconductor layer has a too large thickness.

The above is the explanation of the oxide semiconductor layer to be used in the present invention.

The first oxide semiconductor layer and the second oxide semiconductor layer as described above may preferably be formed by a sputtering method using a sputtering target (which may hereinafter be referred to as the "target"). The supporting method makes it possible to easily form a thin-film having excellent uniformity of composition or film thickness in the film surface. The oxide can also be formed by a chemical film-formation method such as a coating method.

As a target to be used in the sputtering method, there may preferably be used a sputtering target containing the elements described above and having the same composition as that of a desired oxide, thereby making it possible to form a thin-film showing small deviation of composition and having the same composition as that of the desired oxide. More specifically, as the target for forming the first oxide semiconductor layer, there can be used an oxide target containing at least one element selected from the group consisting of In, Ga, Zn and Sn.

As the target for forming the second oxide semiconductor layer, there can be used an oxide target containing at least one element (the X group element) selected from the group consisting of In, Ga, Zn and Sn, and at least one element (the Y group element) selected from the group consisting of Al, Si, Ti, Hf, Ta, Ge, W and Ni. It is particularly preferred that the Y group element may be at least one selected from the group consisting of Si, Hf and Ni.

The first oxide semiconductor layer and the second oxide semiconductor layer may preferably be formed successively, while keeping under vacuum, by the sputtering method. This is because exposure to air in the formation of the first oxide semiconductor layer and the second oxide semiconductor layer leads to the attachment of water or organic substances in the air to the thin-film surface, which is responsible for the contamination (quality failure).

The sputtering target used in the formation of the first oxide semiconductor layer can also be used in the formation of the second oxide semiconductor layer. That is, the supporting target used in the formation of the first oxide semiconductor layer and the sputtering target of the Y group element may be used for the co-sputtering (e.g., chip-on co-sputtering) to form the second oxide semiconductor layer. The use of the sputtering target used in the formation of the first oxide semiconductor layer makes it possible that the kind of the X group element and the ratio of the X group element among the respective elements contained in the second oxide semiconductor layer become equal to the kind of the Z group element and the ratio of the Z group element among the respective elements contained in the first oxide semiconductor layer.

A target as described above can be produced, for example, by a powder sintering method.

The sputtering using a target as described above may preferably be carried out under the conditions that substrate temperature is set to room temperature and oxygen addition amount is appropriately controlled. The oxygen addition amount may appropriately be controlled according to the configuration of a sputtering system and the composition of the target. The oxygen addition amount may preferably be controlled by the addition of oxygen so that the carrier concentration of a semiconductor becomes approximately from $10^{15}$ to $10^{16}$ cm$^{-3}$.

Furthermore, when an oxide as described above is used as the semiconductor layer of a TFT, the oxide semiconductor layer may preferably have a density of 5.8 g/cm$^3$ or higher (described below). To form a film of such an oxide, the sputtering conditions may preferably be controlled in an appropriate manner, such as gas pressure, input power to be applied to a sputtering target(s), T-S distance (the distance between the sputtering target(s) and the substrate), and substrate temperature during film formation by sputtering. For example, when the gas pressure is lowered during film formation, sputtered atoms can be prevented from scattering one another, thereby making it possible to form a dense (high-density) film. Thus, the total gas pressure during film formation may preferably be as low as possible to an extent that sputtering discharge is stabilized, and it may preferably be controlled in a range of approximately from 0.5 mTorr to 5 mTorr, more preferably in a range of approximately from 1 mTorr to 3 mTorr. Furthermore, the input power may preferably be as high as possible, and it is recommended to be set to about 2.0 W/cm$^2$ or higher in DC or RF mode. The substrate temperature during film formation may preferably be as high as possible, and it is recommended to be set to a range of approximately from room temperature to 200° C.

The interconnect structure of the present invention is only required to have an oxide semiconductor layer as described above (a layered structure of the first oxide semiconductor layer and the second oxide semiconductor layer), and the other structure including a gate insulator layer is not particularly limited. For example, the interconnect structure of the present invention can suitably be used for TFTs. Each TFT may have at least a gate electrode, a gate insulator layer, an oxide semiconductor layer as described above, a source electrode, and a drain electrode on a substrate, and the structure thereof is not particularly limited, so long as it is usually used.

An oxide semiconductor layer as described above may preferably have a density of 5.8 g/cm$^3$ or higher. An increase in the density of the oxide semiconductor layer causes both a decrease in the number of defects in the film to improve the film quality and a decrease in the atomic distance to largely increase the field-effect mobility of each TFT element, thereby increasing electric conductivity and improving stability to stress against light irradiation. The oxide semiconductor layer may preferably have a density as higher as possible, more preferably 5.9 g/cm$^3$ or higher, and still more preferably 6.0 g/cm$^3$ or higher. The density of an oxide semiconductor layer is measured by a method described below in Examples.

The density described above means the entire density of an oxide semiconductor layer (i.e., the density of a layered structure of the first oxide semiconductor layer and the second oxide semiconductor layer). In the formation of the oxide semiconductor layer, it is not essential to make the densities of the first and second oxide semiconductor layers approximately equal to each other. For example, the second oxide semiconductor layer coming in contact with the gate insulator layer may have a higher density than that of the first oxide semiconductor layer. This leads to a lowering of the defect level density on the boundary between the gate insulator layer and the oxide semiconductor layer, thereby further improving stability to light stress, in particular. As a matter of course, the first and second oxide semiconductor layers may are made to have a high density on the same level, and field effect mobility can be further improved by making the first oxide semiconductor layer transporting many electrons to have a high density.

Figure 3:
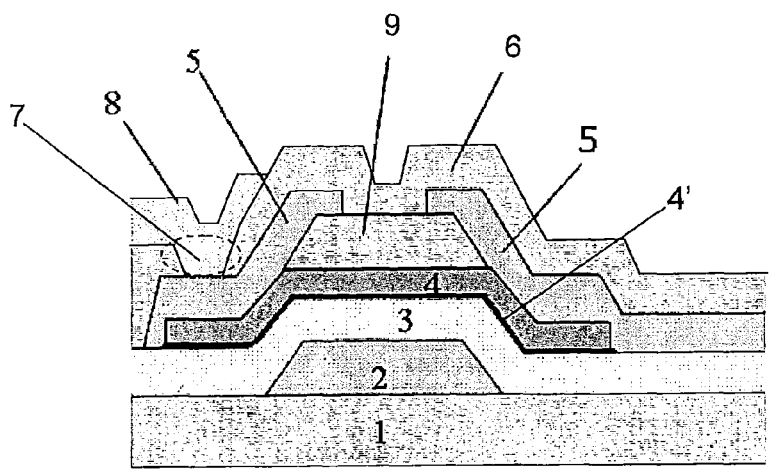
FIG. 3 is another schematic cross-sectional view for the explanation of a thin-film transistor with a layered product of the first oxide semiconductor layer and the second oxide semiconductor layer as the oxide semiconductor layer to be used in the present invention.

The following will explain, by reference to FIG. 3, embodiments of a method for producing a TFT as described above. FIG. 3 and the following production method indicate one example of preferred embodiments of the present invention, and they are not intended to limit the present invention. For example, FIG. 3 shows a TFT having a bottom gate type structure; however, the present invention is not limited thereto, and the TFTs of the present invention may be top gate type TFTs each having a gate insulator layer and a gate electrode successively on an oxide semiconductor layer. Even in the top gate type TFT, the second oxide semiconductor layer may be interposed between the first oxide semiconductor later and the gate insulator layer.

As shown in FIG. 3, a gate electrode 2 and a gate insulator layer 3 are formed on a substrate 1, and a second oxide semiconductor layer 4' and a first oxide semiconductor layer 4 are formed thereon. A source-drain electrode 5 is formed on the first oxide semiconductor layer 4, and a passivation layer (insulator layer) 6 is formed thereon, and a transparent conductive film 8 is electrically connected to the drain electrode 5 through a contact hole 7.

The method for forming the gate electrode 2 and the gate insulator layer 3 on the substrate 1 is not particularly limited, and any of the methods usually used can be employed. Further, the kinds of the gate electrode 2 and the gate insulator layer 3 are not particularly limited, and there can be used those which have widely been used. For example, metals having low electric resistance, such as Al and Cu, and their alloys, can preferably be used for the gate electrode 2. Typical examples of the gate insulator layer 3 may include a silicon oxide layer, a silicon nitride layer, and a silicon oxynitride layer. In addition, there can also be used oxides such as $Al_2O_3$ and $Y_2O_3$, and those which are formed by layering them.

Then, an oxide semiconductor layer (the second oxide semiconductor layer 4' and the first oxide semiconductor layer 4) is formed. The oxide second semiconductor layer 4' can be formed by a DC sputtering method or an RF sputtering method using a sputtering target of the same composition as the X group element and the Y group element both contained in the second oxide semiconductor layer. Alternatively, the film formation may also be carried out by a co-sputtering method with a chip of the Y group element paced on a target of the X group element.

Similarly, the first oxide semiconductor layer 4 can also be formed by a DC sputtering method or an RF sputtering method using a sputtering target of the same composition as described above. The second oxide semiconductor layer 4' and the first oxide semiconductor layer 4 may preferably be formed in a successive and continuous manner under vacuum.

The first oxide semiconductor layer 4 is subjected to wet etching and then patterning. Just after the patterning, heat treatment (pre-annealing) may preferably be carried out for the purpose of improving the quality of the first oxide semiconductor layer 4, resulting in an increase in the on-state current and field-effect mobility as the transistor characteristics and an improvement in the transistor performance. The pre-annealing conditions may be, for example, such that the temperature is from about 250° C. to about 400° C. and the time is from about 10 minutes to about 1 hour.

After the pre-annealing, an etch stopper layer 9 may be formed. For the etch stopper layer 9, an insulator layer such as $SiO_2$ is usually used. The source-drain electrode 5 may be formed without forming the etch stopper layer 9. When the source-drain electrode is subjected to etching, there is fear that the oxide semiconductor layer is damaged to deteriorate transistor characteristics. In such a case, the etch stopper layer 9 may preferably be formed.

However, depending on the production method, there are cases in which the oxide semiconductor layer is not damaged, even if the etch stopper layer is not provided. Therefore, the etch stopper layer may be formed, if necessary. For example, when the source-drain electrode is processed by a lift-off method, the etch stopper layer is not needed because of no damage on the semiconductor layer.

The kind of the source-drain electrode 5 is not particularly limited, and there can be used those which have widely been used. For example, similarly to the gate electrode, metals such as Al and Cu or their alloys may be used, or pure Ti may also be used as in Examples described below. A sputtering method is widely used for the formation of the electrode.

Then, the passivation layer 6 is formed on the source-drain electrode 5 by a CVD (Chemical Vapor Deposition) method. For the passivation layer 6 to be formed by the CVD method, there can be used, for example, $SiO_2$, SiN and SiON. The passivation layer 6 may also be formed using a sputtering method. The surface of the semiconductor layer may easily become conductive due to plasma-induced damage by CVD (this seems to be because oxygen defects formed on the surface of the first oxide semiconductor act as electron donors), and therefore, $N_2O$ plasma irradiation was carried out before the formation of the passivation layer 6 in Examples described below. The conditions described in the following literature document were employed as the $N_2O$ plasma irradiation conditions.

J. Park et al., Appl. Phys. Lett., 1993, 053505 (2008)

Then, according to a conventional method, the transparent conductive film 8 is electrically connected to the drain electrode 5 through the contact hole 7. The kinds of the transparent conductive film and drain electrode are not particularly limited, and there can be used those which have usually been used. For the drain electrode, there can be used, for example, materials exemplified for the source-drain electrode described above.

EXAMPLES

The present invention will hereinafter be described more specifically by way of Examples, but the present invention is not limited to the following Examples. The present invention can be put into practice after appropriate modifications or variations within a range meeting the gist described above and below, all of which are included in the technical scope of the present invention.

Experiment 1

According to a method as described above, a thin-film transistor (TFT) shown in FIG. 1 was produced, and TFT characteristics before and after the formation of a passivation layer (insulator layer) 6 were evaluated (in this experiment, an etch stopper layer 9 was not formed).

First, a Ti thin-film of 100 nm in thickness as a gate electrode 2 and $SiO_2$ (200 nm) as a gate insulator layer 3 were successively formed on a glass substrate 1 ("EAGLE 2000" available from Corning Incorporated, having a diameter 100 mm and a thickness of 0.7 mm). The gate electrode 2 was formed using a pure Ti sputtering target by a DC sputtering method under the conditions: film formation temperature, room temperature; film formation power, 300 W; carrier gas, Ar; and gas pressure, 2 mTorr. Further, the gate insulator layer 3 was formed by a plasma CVD method under the conditions: carrier gas, a mixed gas of $SiH_4$ and $N_2O$; film formation power, 100 W; and film formation temperature, 300° C.

Then, oxide semiconductor layers having various compositions and structures as described below were formed by a sputtering method under the conditions described below using sputtering targets having compositions corresponding to the compositions of the oxide semiconductor layers. As the oxide semiconductor layers, the semiconductor layer of the present invention consisting of the first oxide semiconductor layer 4 and the second oxide semiconductor layer 4' was formed (Example 1). As a comparative example, a thin-film transistor (Comparative Example 1) having a conventional oxide semiconductor layer 4 (IGZO) was produced (in which the second oxide semiconductor layer 4' was not formed).

Substrate temperature: room temperature
Gas pressure: 5 mTorr
Oxygen partial pressure: $100 \times O_2/(Ar+O_2)=2\%$ The oxide semiconductor layer of Example 1 is a layered product consisting of IGZO as the first oxide semiconductor layer 4 and IGZO containing the Y group element as the second oxide semiconductor layer 4'. First, the second oxide semiconductor layer 4' was formed on the gate insulator layer 3. More specifically, the second oxide semiconductor layer 4' (having a thickness of 5 nm and an Si content of 3 atomic %, relative to the total content of all metals (In, Ga, Zn and/or Si) contained in the second oxide semiconductor layer 4', except oxygen) was formed on the gate insulator layer 3 by a co-sputtering method using a target with an Si chip as the Y group element placed on a sputtering target of IGZO (having an atomic ratio of In:Ga:Zn=2:2:1) as the X group element. Furthermore, the first oxide semiconductor 4 (having a thickness of 50 nm) was formed thereon by a DC sputtering method using a sputtering target of IGZO (having an atomic ratio of In:Ga:Zn=2:2:1).

At that time, a series of film formation, from the formation of the second oxide semiconductor layer 4' to the formation of the first oxide semiconductor layer 4, was carried out in a continuous manner without opening the chamber to the air during the formation.

The respective contents of metal elements in the oxide semiconductor layer thus obtained were analyzed by an XPS (X-ray photoelectron spectroscopy) method. More specifically, after sputtering to a depth of about 5 nm from the outermost surface by Ar ion, the analysis was carried out under the conditions described below (the measurement of the semiconductor layer by the XPS method was carried out using a sample having thin-films each having a thickness of 50 nm formed on an Si substrate and respectively having the same compositions as the first and second semiconductor layers).

X-ray source: Al $K_\alpha$
X-ray output: 350 W
Photoelectron take-off angle: 20°

After each oxide semiconductor layer was formed in the manner described above, patterning was carried out by photolithography and wet etching. "ITO-07N," available from Kanto Chemical Co., Inc., was used as a wet etchant. In this Example, it was confirmed that no residue was observed by wet etching and etching was properly achieved in all of the semiconductor layers subjected to experiments.

After patterning of each oxide semiconductor layer, pre-annealing treatment was carried out to improve the film quality. The pre-annealing was carried out at 350° C. under air atmosphere for 1 hour.

Then, a source-drain electrode 5 was formed by a lift-off method using pure Ti. More specifically, after patterning was carried out using a photoresist, a Ti thin-film (having a thickness of 100 nm) was formed by a DC sputtering method. The method of forming the Ti thin-film for a source-drain electrode was the same as that used in the case of the gate electrode 2 described above. Then, an unnecessary photoresist was removed with an ultrasonic washing apparatus in acetone, resulting in a TFT having a channel length of 10 μm and a channel width of 200 μm.

After the source-drain electrode 5 was formed as described above, a passivation layer 6 was formed thereon. A layered film (having the total thickness of 400 nm) consisting of $SiO_2$ (having a thickness of 200 nm) and SiN (having a thickness of 200 nm) was used as the passivation layer 6. The formation of $SiO_2$ and SiN described above was carried out by a plasma CVD method using "PD-220NL" available from SAMCO Inc. In this Example, after plasma treatment was carried out by $N_2O$ gas, the $SiO_2$ film and the SiN film were successively formed. A mixed gas of $N_2O$ and $SiH_4$ was used for the formation of the $SiO_2$ film, and a mixed gas of $SiH_4$, $N_2$ and $NH_3$ was used for the formation of the SiN film. In both cases, the film formation power was set to 100 W and the film formation temperature was set to 150° C.

Then, a contact hole 7 to be used for probing to evaluate transistor characteristics was formed in the passivation layer 6 by photolithography and dry etching. Then, an ITO film (having a thickness of 80 nm) was formed as a transparent conductive film 8 using a DC sputtering method under the conditions that the carrier gas was a mixed gas of argon gas and oxygen gas; the film formation power was 200 W; and the gas pressure was 5 mTorr. Thus, TFTs such as shown in FIG. 1 were produced and following test was carried out.

Comparative Example 1

An oxide semiconductor layer 4 of amorphous IGZO (having an atomic ratio of In:Ga:Zn=2:2:1 and a thickness of 50 nm; and having a single layer structure) was formed as the oxide semiconductor layer by a sputtering method (in which the second oxide semiconductor layer 4' was not formed), followed by the production method described above to produce a TFT as Comparative Example 1.

For each of the TFTs thus obtained, the following measurements: (1) transistor characteristics (drain current-gate voltage characteristics, $I_d$-$V_g$ characteristics), (2) threshold voltage, (3) S value, and (4) field-effect mobility, were carried out as described below.

(1) Measurement of Transistor Characteristics

The transistor characteristics were measured using a semiconductor parameter analyzer, "4156C" available from National Instruments Inc. The detailed measurement conditions were as follows:

Source voltage: 0 V
Drain voltage: 10 V
Gate voltage: from −30 to 30 V (measurement interval: 0.25 V)

(2) Threshold Voltage ($V_{th}$)

The threshold voltage is roughly a value of the gate voltage when the transistor is sifted from the off state (the state where the drain current is low) to the on state (the state where the drain current is high). In this Example, the voltage when the drain current is around 1 nA between the on-state current and the off-state current was defined as the threshold voltage, and the threshold voltage of each TFT was measured.

(3) S Value

The S value was defined as the minimum value of the gate voltage necessary for increasing the drain current by one digit, and lower S values indicate that the TFT has more favorable characteristics. More specifically, when the S value was 0.60 V/decade or lower, the TFT was evaluated as passing.

(4) Field-Effect Mobility μ

The field-effect mobility μ was derived from the TFT characteristics in a linear region where $V_g > V_d - V_{th}$. In the linear region, the filed-effect mobility is derived by the expression described below, in which $V_g$ and $V_d$ are the gate electrode and drain electrode, respectively; $I_d$ is the drain current; L and W are the channel length and channel width of a TFT element, respectively; $C_i$ is the capacitance of the gate insulator layer; and $\mu_{FE}$ is the field-effect mobility. The $\mu_{FE}$ is derived by the expression described below. In this Example, the field-effect mobility μ was derived from a gradient of drain current-gate voltage characteristics ($I_d$-$V_g$ characteristics) around gate voltages falling in the linear region. The field effect mobility after the stress test described below is shown in Table 1.

$$\mu_{FE} = \frac{\partial I_d}{\partial V_g}\left(\frac{L}{C_i W V_d}\right) \qquad [\text{Math 1}]$$

(Evaluation of Stress Resistance)

In this Example, a stress test was carried out by irradiation of light while applying negative bias to the gate electrode 2. The stress test conditions were as described below.

Gate voltage: −20V
Substrate temperature: 60° C.
Stress test time: 1 hour
Light intensity: 0.1 μW/cm²
Peak wavelength: 400 nm The stress test was carried our for the TFT elements produced.

Figure 4A:
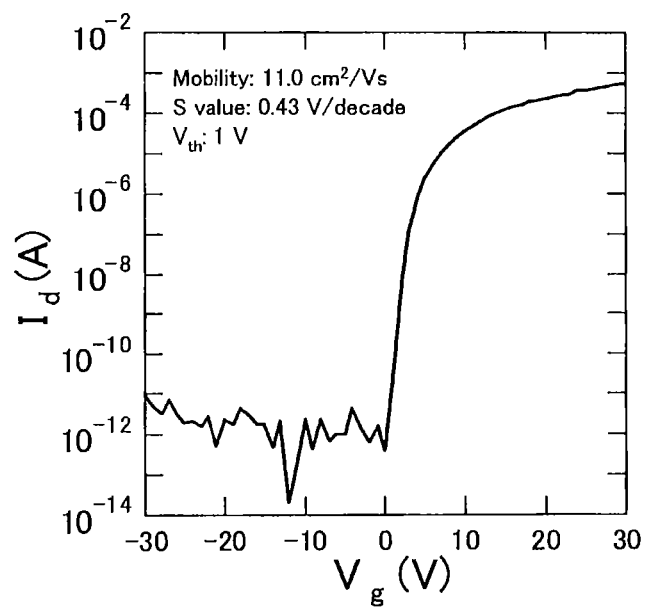
FIG. 4A is a graph showing the TFT characteristics before and after the stress tests in Comparative Example 1 using IGZO as the oxide semiconductor layer.
Figure 4B:
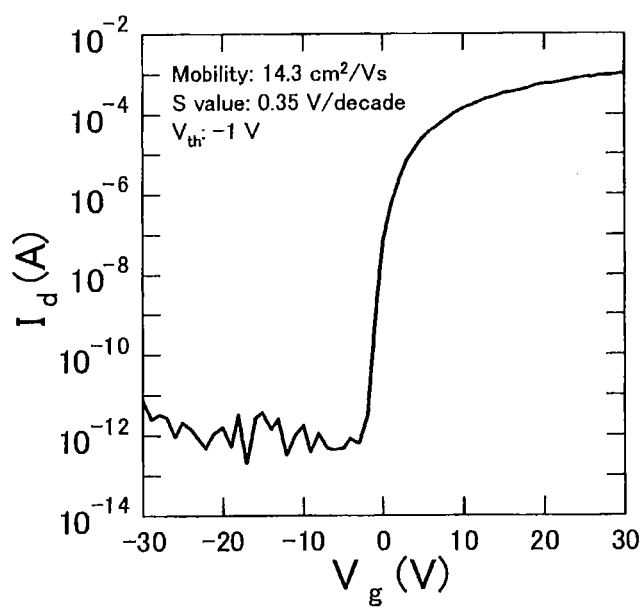
FIG. 4B is a graph showing the TFT characteristics before and after the stress tests in Example 1 using a layered structure of the first oxide semiconductor layer (IGZO) and the second oxide semiconductor layer (IGZO+Si) as the oxide semiconductor layer.

FIGS. 4A and 4B show the transistor characteristics. FIG. 4A shows the transistor characteristics of the TFT in Comparative Example 1, and it is found that when the gate voltage is increased from −30 V to 30 V, the drain current starts to increase at around 0 V and switching characteristics are exhibited. The parameters measured from the transistor characteristics are the threshold voltage of 1 V, the S value of 0.43 V/decade, and the mobility μ of about 11 cm²/Vs, all of which show favorable characteristics as the thin-film transistor.

FIG. 4B shows the transistor characteristics of the TFT in Example 1, and it is found that the drain current starts to increase at around 0 V and switching characteristics similarly to the comparative example. The parameters derived from the transistor characteristics are the threshold voltage $V_{th}$ of −1 V, the S value of 0.35 V/decade, and the mobility μ of 14.3 cm²/Vs.

The following can be found from the transistor characteristics shown in FIGS. 4A and 4B. When a layered product of the first oxide semiconductor layer 4 and the second oxide semiconductor layer 4' according to the present invention is provided as the oxide semiconductor layer (Example 1), the curve showing the transistor characteristics becomes to have a sharp rising edge, resulting in an improvement (lowering) in the S value. The on-state current (i.e., the drain current at Vg=30 V) is $5.0 \times 10^{-4}$ A when the second oxide semiconductor layer is not formed, but increases up to $1.0 \times 10^{-3}$ A when the second oxide semiconductor layer is formed. This confirms that the formation of the second oxide semiconductor layer also provides an increase in mobility (field effect mobility μ) to improve the characteristics. It is assumed that the density of defect levels was reduced to increase mobility, resulting in a lower S value, by the disposition of the second oxide semiconductor layer 4' containing an element (the Y group element) such as Si, which can stably binds to unstable oxygen in the semiconductor on the boundary between the IGZO (the first oxide semiconductor layer 4) and the gate insulator layer 3.

Then, using the TFT elements in Example 1 and Comparative Example 1 described above, a stress test was carried out by light irradiation and negative bias application, the results of which are shown below.

Figure 5:
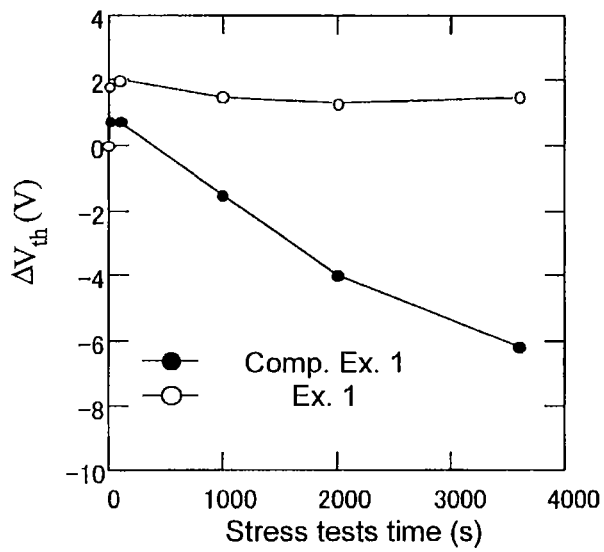
FIG. 5 is a graph showing relationships between the stress tests time and the threshold voltage variation ($\Delta V_{th}$) in Example 1 and Comparative Example 1.

FIG. 5 shows the relationship between the variation $\Delta V_{th}$ in the threshold voltage of each TFT and the stress tests time. As can be seen from the graph of Comparative Example 1, the threshold voltage $V_{th}$ is shifted to the negative side with an increase in the stress tests time, and the threshold voltage variation $\Delta V_{th}$ is −6.2 V for 1 hour. It is assumed that the threshold voltage was shifted because holes were generated by light irradiation and accumulated by bias application on the boundary between the gate insulator layer and the semiconductor.

On the other hand, the TFT of Example 1 shows a smaller threshold voltage variation $\Delta V_{th}$ than that of Comparative Example 1, which $\Delta V_{th}$ is 1.5 V for 1 hour.

From these results, it was confirmed that when the structure of the oxide semiconductor layer (the first oxide semiconductor layer and the second oxide semiconductor layer (formed between the gate insulator layer and the first oxide semiconductor layer)) defined in the present invention is adopted as in Example 1, there can be exhibited the effect of suppressing a variation in the TFT characteristics with stress tests of light and negative bias. This is assumed to be because the interposition of the second oxide semiconductor layer containing Si (the Y group element) between the gate insulator layer and the first oxide semiconductor layer provides stable binding between the gate insulator layer and the oxide semiconductor, resulting in a state where defects are hardly be formed.

Experiment 2

Various TFTs were produced in the same manner as Experiment 1 described above, except that the kind of the Y group element contained in the second oxide semiconductor layer in the oxide semiconductor layer (a layered product formed by the first oxide semiconductor layer (IGZO) and the second oxide semiconductor layer (IGZO+the Y group element)) of the present invention was changed. The composition of IGZO (the Z group element and the X group element) in the first oxide semiconductor layer and the second oxide semiconductor layer was set to be In:Ga:Zn=2:2:1. The first oxide semiconductor layer was set to have a thickness of 50 nm and the second oxide semiconductor layer was set to have a thickness of 5 nm, and both layers were formed in a continuous manner using a DC sputtering method. The TFTs were measured for TFT characteristics and subjected to the stress test. The results are shown in Table 1.

In Table 1, the threshold voltage variation $\Delta_{th}$=−6.2 V (1 hour) in the stress test of Comparative Example 1 (with a conventional single layer of IGZO, No. 1 in Table 1) described above was used as the criterion, the TFTs showing absolute values (lower than 6.2 V) of $\Delta_{th}$ smaller than the criterion in the test results were evaluated as passing, but the TFTs showing absolute values (equal to or higher than 6.2 V) of $\Delta_{th}$ larger than the criterion in the test results were evaluated as not passing. Regarding the mobility (field effect mobility μ), the TFTs exhibiting mobility corresponding to 80% or higher of the mobility in Comparative Example 1 (8.8 cm$^2$/Vs or higher) were evaluated as passing, but the TFTs exhibiting mobility lower than this value (<8.8 cm$^2$/Vs) was evaluated as not passing (see the column of "Mobility (cm$^2$/Vs)" in the table). Regarding the S value, the TFTs exhibiting the S value of 0.60 V/decade or lower were evaluated as passing, but the TFTs exhibiting the S value higher than this value (>0.60 V/decade) were evaluated as not passing. The rightmost column of Table 1 was entitled "Judgment (total judgment)" in which the TFTs evaluated as passing in all the results described above were judged as "A" and the TFTs evaluated as not passing in any one of the results described above were judged as "B".

TABLE 1

| No. | Added element | Addition amount (at. %) | Mobility (cm$^2$/Vs) | S value | $V_{th}$ variation | Judgment |
|---|---|---|---|---|---|---|
| 1 | — | — | 11.0 | 0.43 | −6.2 | — |
| 2 | Si | 0.7 | 15.2 | 0.32 | −2.3 | A |
| 3 | Si | 2.3 | 14.3 | 0.35 | 1.5 | A |
| 4 | Si | 6.8 | 12.3 | 0.43 | −1.4 | A |
| 5 | Si | 9.5 | 8.0 | 0.7 | −2.2 | B |
| 6 | Hf | 0.5 | 13.1 | 0.37 | −2.1 | A |
| 7 | Hf | 2.4 | 12.1 | 0.42 | −1.3 | A |
| 8 | Hf | 7.3 | 11.6 | 0.44 | 0.6 | A |
| 9 | Hf | 10.1 | 8.1 | 0.95 | −1.7 | B |
| 10 | Ni | 0.5 | 14.7 | 0.34 | −2.1 | A |
| 11 | Ni | 1.7 | 13.2 | 0.35 | −1.8 | A |
| 12 | Ni | 4.4 | 11.5 | 0.46 | −1.3 | A |
| 13 | Ni | 8.7 | 7.5 | 1.01 | −3.1 | B |
| 14 | Al | 3.0 | 12.8 | 0.39 | 1.5 | A |
| 15 | Ti | 2.2 | 13.1 | 0.38 | 0.6 | A |
| 16 | Ta | 2.4 | 13.3 | 0.4 | −1.8 | A |
| 17 | Ge | 3.5 | 11.6 | 0.48 | −2.1 | A |
| 18 | W | 2.7 | 14 | 0.35 | −0.7 | A |
| 19 | Mn | 2.2 | — (no switching) | — | — | B |
| 20 | Cu | 2.5 | — (no switching) | — | — | B |

The following discussion can be made from Table 1.

First, Nos. 2 to 4 are examples in which Si was contained as the Y group element in the preferred range of the present invention, all of which examples had favorable characteristics (the column of judgment=A). In contrast to this, the mobility was lowered and the S value was increased in No. 5 where the Si content was higher than the preferred upper limit of the present invention.

Similarly, Nos. 6 to 8 are examples in which Hf was contained as the Y group element in the preferred range of the present invention, all of which examples had favorable characteristics (the column of judgment=A). In contrast to this, the mobility was lowered and the S value was increased in No. 9 where the Hf content was higher than the preferred range of the present invention.

Similarly, Nos. 10 to 12 are examples in which Ni was contained as the Y group element in the preferred range of the present invention, all of which examples had favorable characteristics (the column of judgment=A). In contrast to this, the mobility was lowered and the S value was increased in No. 13 where the Ni content was higher than the preferred upper limit of the present invention.

Nos. 14 to 18 are examples in which each of Al, Ti, Ta, Ge and W was contained as the Y group element in the preferred range of the present invention, all of which examples had favorable characteristics (the column of judgment=A).

From the experimental results described above, it was demonstrated that even when the Y group element other than Si was used, TFTs having all the desired characteristics in combination were obtained in the cases where the Y group element was contained in the preferred range of the present invention.

On the other hand, both Nos. 19 and 20 are examples in which either of elements other than the Y group element defined in the present invention was used. In No. 19 (Mn-added example) and No. 20 (Cu-added example), switching characteristics were not exhibited, and therefore, the mobility, S value and $V_{th}$ variation were not measured ("–" was filled in the columns of the respective characteristics).

Experiment 3

Then, to examine the relationship between the mobility ($cm^2$/Vs) and the thickness of the second oxide semiconductor layer, the semiconductor layer consisting of the first oxide semiconductor layer (IGZO: 50 nm) and the second oxide semiconductor layer (IGZO (the X group element) and 2.4 atomic % Si (the Y group element)) was produced in the same manner as in Experiment 1 described above, and TFT characteristics were examined. At that time, the thickness of the second oxide semiconductor layer was changed between 0.5 nm and 10 nm.

Figure 6:
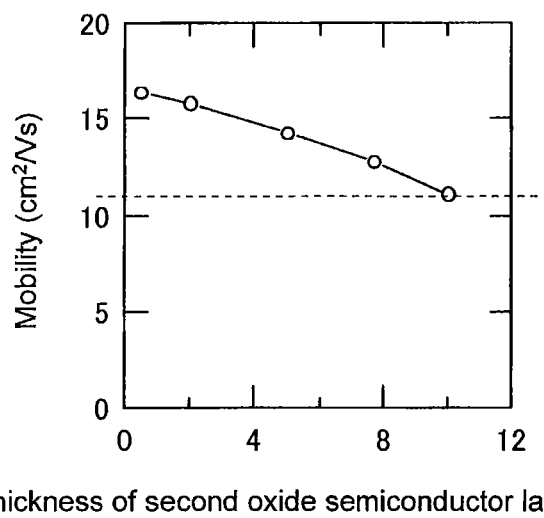
FIG. 6 is a graph showing a relationship between the thickness of the second oxide semiconductor layer included in the oxide semiconductor layer and the mobility (cm$^2$/Vs).

As shown in FIG. 6, the second oxide semiconductor layer having a smaller thickness exhibited higher mobility. This result founds that the second oxide semiconductor layer is enough to have a thickness of 10 nm and the effect of reducing the density of defects by the addition of the Y group element is also affected to some degree by the thickness.

The Si-containing oxide is assumed to have an amorphous structure because it was able to undergo favorable processing by wet etching.

Taking into comprehensive consideration the results of Experiments 1 to 3 described above, it was demonstrated that the addition of the Y group element at an appropriate amount and the control of the ratio of the Y group element to the X group element in a preferred range make it possible to achieve high mobility even after the formation of a passivation layer and provide favorable TFTs showing a small variation in the substrate surface.

Experiment 4

In this experiment, the influence of gas pressure during the film formation by sputtering on the density of the first or second oxide semiconductor layer (single layer), which forms the oxide semiconductor layer, was examined as a basic experiment. This experiment involved no formation of an oxide semiconductor layer with a layered structure (the first oxide semiconductor layer and the second oxide semiconductor layer) corresponding to the present invention.

More specifically, density measurement was carried out by the method described below for oxide films (having a thickness of 100 nm) obtained by the use of oxides having the compositions shown in Table 2 and the control of gas pressure to 1, 3 or 5 mTorr during the film formation by sputtering. In Table 2, the ratios in the column entitled "Composition" are atomic ratios, and Nos. 1 to 3 correspond to the first oxide semiconductor layer and Nos. 4 and 5 correspond to the second oxide semiconductor layer. In Nos. 4 and 5, the wording "5.0 at. % Si" means 5 atomic %, relative to the total contents of all metals (In, Ga, Zn and/or Si) contained in the second oxide semiconductor layer, except oxygen.

(Measurement of Density of Oxide Film)

The density of each oxide film was measured by XRR (X-ray reflectivity method). The detailed measurement conditions were as described below.

Analysis apparatus: Horizontal type X-ray diffraction apparatus Smart Lab available from Rigaku Co., Ltd.
Target: Cu (source: Kα ray)
Target output power: 45 kV-200 mA
Preparation of Measurement Samples Each sample was prepared by forming a film (having a thickness of 100 nm) of each oxide having each composition on a glass substrate under the sputtering conditions described below, and then carrying out the same heat treatment as the pre-annealing treatment in the TFT production process of Experiment 1 described above.

Sputtering gas pressure: 1 mTorr, 3 mTorr or 5 mTorr
Oxygen partial pressure: 100×$O_2$/(Ar+$O_2$)=2%
Film formation power density: DC 2.55 W/$cm^2$
Heat treatment: 350° C. under an air atmosphere for 1 hour
These results are shown together in Table 2.

TABLE 2

| No. | Composition | Gas pressure during film formation | Density (g/$cm^3$) |
|---|---|---|---|
| 1 | IGZO (In:Ga:Zn = 2:2:1) | 1 mTorr | 6.12 |
| 2 | IGZO (In:Ga:Zn = 2:2:1) | 3 mTorr | 6.03 |
| 3 | IGZO (In:Ga:Zn = 2:2:1) | 5 mTorr | 5.94 |
| 4 | IGZO (In:Ga:Zn = 2:2:1) + 5.0 at. % Si | 1 mTorr | 6.11 |
| 5 | IGZO (In:Ga:Zn = 2:2:1) + 5.0 at. % Si | 5 mTorr | 5.92 |

Table 2 reveals that when the gas pressure during the film formation is lowered from 5 mTorr to 1 mTorr, the oxide films have increased densities regardless of their compositions. This seems to be because a lowering in the gas pressure during the sputtering film formation suppressed the scattering of sputtered atoms (molecules) to provide high-density films with few defects. The number of scattering is more decreased at a lower gas pressure during the film formation, but when the gas pressure is too low, discharge during the sputtering becomes unstable; therefore, in actual cases, it is preferable to appropriately control the gas pressure during the film formation, taking into consideration their balance.

The above-described experiment was carried out beyond the upper limit (10 nm) of the preferred thickness of the second layer. In principle, the measurement of film density is not influenced by the film thickness. Therefore, the same experimental results as described above seem to be obtained even when the second layer is controlled to have a thickness in the preferred range of the present invention.

Experiment 5

The influence of gas pressure during the sputtering film formation to the density of an oxide semiconductor layer (a layered structure of the first oxide semiconductor layer and the second oxide semiconductor layer) was examined herein on the basis of the results in Experiment 4 described above. The detailed compositions of the oxide semiconductor layers used in this experiment are as shown in Nos. 1 to 3 of Table 3 and all the same as each other. The composition of IGZO (the Z group element and the X group element) in the first oxide semiconductor layer and the second oxide semiconductor layer was set to be In:Ga:Zn=2:2:1.

More specifically, TFTs as shown in FIG. 1 were produced in the same manner as in Experiment 1 described above, except that the respective gas pressures were varied as described in Table 3, when the oxide semiconductor layers (the first oxide semiconductor layer and the second oxide semiconductor layer) of Nos. 1 to 3 shown in Table 3 were formed by a sputtering method. For the TFTs thus obtained, the density of each oxide semiconductor layer was measured in the same manner as in Experiment 4 described above, and the field effect mobility and S value before the stress test, and a variation of threshold voltage ($V_{th}$ variation) before and after the stress test (light irradiation and application of negative bias), were measured in the same manner as in Experiment 1 described above.

These results are shown together in Table 3.

TABLE 3

| No. | Oxide semiconductor layer | Composition | Gas pressure during film formation | Mobility (cm$^2$/Vs) | S value | $V_{th}$ variation | Judgment |
|---|---|---|---|---|---|---|---|
| 1 | First semiconductor layer | IGZO | 5 mTorr | 14.3 | 0.35 | 1.5 | A |
|   | Second semiconductor layer | IGZO + 2.3 at. % Si | 5 mTorr | | | | |
| 2 | First semiconductor layer | IGZO | 5 mTorr | 14.7 | 0.33 | 1.1 | A |
|   | Second semiconductor layer | IGZO + 2.3 at. % Si | 1 mTorr | | | | |
| 3 | First semiconductor layer | IGZO | 1 mTorr | 16.5 | 0.23 | 0.9 | A |
|   | Second semiconductor layer | IGZO + 2.3 at. % Si | 1 mTorr | | | | |

As shown in Table 3, when the gas pressure during the sputtering film formation was lowered from 5 mTorr to 1 mTorr, favorable results were obtained, such as an increase in the filed effect mobility of the TFTs, a lowering in the S value, and a decrease in the variation of threshold voltage ($V_{th}$ variation). This seems to be because an increase in the density of an oxide semiconductor layer caused a decrease of defects in the semiconductor layer to improve its film quality.

More specifically, as compared with the case where only the gas pressure during the formation of the second oxide semiconductor layer is lowered as in No. 2 and the case where both the respective gas pressures during the formation of the first and second oxide semiconductor layers are lowered as in No. 3, more excellent characteristics were obtained in No. 3 than in No. 2, such as a further improvement in the mobility, a further lowering in the S value, and a further decrease in the $V_{th}$ variation. Therefore, it seems to be the most effective to make both the first and second oxide semiconductor layers have high densities in order to ensure more excellent characteristics.

The same effects (an improvement in the TFT characteristics by making the oxide semiconductor layer have high density) as described above are not limited to the oxide semiconductor layer having the composition shown in Table 3 and are assumed as being similarly exhibited even when other oxide semiconductor layers fulfilling the requirements of the present invention are used.

Experiment 6

The experiment described above was carried out by the use of IGZO having an In:Ga:Zn atomic ratio of 2:2:1 as the base for the X group element and the Z group element both con- tained in the oxide semiconductor layer, to which the present invention is not limited, but it was examined that, for example, even when oxides having an In:Ga:Zn atomic ratio of about 1:1:1 were used, those fulfilling the requirements of the present invention were able to provide favorable characteristics.

More specifically, TFTs were produced in the same manner as in Experiment 1 described above, except that the second oxide semiconductor layer was formed using a target with an Si, Hf or Ni chip as the Y group element attached onto a sputtering target having an In:Ga:Zn ratio (atomic ratio) nearly equal to 1:1:1 and the first oxide semiconductor layer is formed using a sputtering target having an In:Ga:Zn ratio (atomic ratio) nearly equal to 1:1:1 so that the layered products of Nos. 2 to 4 shown in Table 4 were obtained. In addition, for comparison, a TFT not having the second oxide semiconductor layer (No. 1) was produced. These TFTs were measured for various characteristics in the same manner as in Experiment 2 described above.

These results are shown in Table 4.

In Table 4, the threshold voltage variation $\Delta V_{th}$=−5.8 V (1 hour) for No. 1 (a conventional single layer of IGZO) as the comparative example in the stress test was used as the criterion, and the TFTs were evaluated as passing when the absolute value of $\Delta V_{th}$ in the test results was smaller than the criterion (smaller than 5.8 V) or as not passing when the absolute value of $\Delta V_{th}$ in the test results was equal to or larger than the criterion (not smaller than 5.8 V). In addition, the TFTs were evaluated as passing when the mobility (filed effect mobility μ) was 80% or higher of the comparative example described above (10.8 cm$^2$/Vs or higher) or as not passing when the mobility (filed effect mobility μ) was lower than 80% of the comparative example described above (<10.8 cm$^2$/Vs). Furthermore, the TFTs were evaluated as passing when the S value was 0.60 V/decade or smaller or as not passing when the S value was larger than 0.60 V/decade (>0.60 V/decade). The rightmost column of Table 4 was entitled "Judgment (total judgment)" in which the TFTs evaluated as passing in all the results described above were judged as "A" and the TFTs evaluated as not passing in any one of the results described above were judged as "B".

TABLE 4

| No. | First semiconductor layer | Second semiconductor layer | Mobility (cm²/Vs) | S value | $V_{th}$ variation | Judgment |
|---|---|---|---|---|---|---|
| 1 | In:Ga:Zn = 33.4:33.3:33.3 | — (none) | 13.5 | 0.36 | −5.8 | — |
| 2 | In:Ga:Zn = 33.4:33.3:33.3 | In:Ga:Zn:Si = 32.6:32.6:32.5:2.3 | 14.9 | 0.33 | −1.5 | A |
| 3 | In:Ga:Zn = 33.4:33.3:33.3 | In:Ga:Zn:Hf = 32.6:32.5:32.5:2.4 | 12.3 | 0.38 | −1.2 | A |
| 4 | In:Ga:Zn = 33.4:33.3:33.3 | In:Ga:Zn:Ni = 32.8:32.8:32.7:1.7 | 13.0 | 0.35 | −1.8 | A |

As shown in Table 4, all the characteristics in Nos. 2 to 4 were favorable (the column of judgment=A), of which second oxide semiconductor layer contains Si, Hf or Ni as the Y group element in the preferred range of the present invention.

The above results confirmed that the present invention make it possible to provide favorable characteristics regardless of the composition of IGZO forming the oxide semiconductor layer.

The experiment described above was carried out by the use of IGZO as the base of the oxide semiconductor layer, to which the present invention is not limited, and the X group element and the Z group element both contained in the oxide semiconductor layer may be as defined in the present invention. There may be used, for example, oxides of Zn—Sn—O containing Zn and Sn as the X group element and the Z group element, or oxides of In—Zn—Sn—O containing In, Zn and Sn as the X group element and the Z group element. It was confirmed by experiments that favorable characteristics are obtained for oxides fulfilling the requirements of the present invention regardless of their compositions.

EXPLANATION OF REFERENCE NUMERALS

1 Substrate
2 Gate electrode
3 Gate insulator layer
4 Oxide semiconductor layer (first oxide semiconductor layer)
4' Oxide semiconductor layer (second oxide semiconductor layer)
5 Source-drain electrode
6 Passivation layer (insulator layer)
7 Contact hole
8 Transparent conductive film
9 Etch stopper layer

The invention claimed is:

1. An interconnect structure, comprising a gate insulator layer and an oxide semiconductor layer on a substrate, wherein:
the oxide semiconductor layer is a layered product comprising:
a first oxide semiconductor layer as an active layer comprising at least one Z group metal selected from the group consisting of In, Ga, Zn and Sn; and
a second oxide semiconductor layer comprising Ga, at least one X group metal selected from the group consisting of In, Zn and Sn and at least one Y group metal selected from the group consisting of Al, Si, Ti, Ta, W and Ni; and
the second oxide semiconductor layer is interposed between the first oxide semiconductor layer and the gate insulator layer,
wherein:
when Al is not present as the at least one Y group metal, a total content of the Y group metal, relative to a total content of all the metals contained in the second oxide semiconductor layer, is from 0.5 to 8.0 atomic %; or
when Al is present as the at least one Y group metal, a total content of the Y group metal, relative to a total content of all the metals contained in the second oxide semiconductor layer, is from 0.5 to 3.0 atomic %.

2. The interconnect structure according to claim 1, wherein the second oxide semiconductor layer has a thickness of from 0.5 to 10 nm.

3. The interconnect structure according to claim 1, wherein:
the X group metal is the same as the Z group metal; and
a ratio of the X group metal among the respective metals contained in the second oxide semiconductor layer is the same as a ratio of the Z group metal.

4. The interconnect structure according to claim 1, wherein the first oxide semiconductor layer has a thickness of from 10 to 200 nm.

5. The interconnect structure according to claim 1, wherein the second oxide semiconductor layer comprises at least one Y group metal selected from the group consisting of Si and Ni.

6. The interconnect structure according to claim 1, wherein the oxide semiconductor layer has a density of 5.8 g/cm³ or higher.

7. A sputtering target, comprising:
Ga;
at least one X group metal selected from the group consisting of In, Zn and Sn; and
at least one Y group metal selected from the group consisting of Al, Si, Ti, Ta, W and Ni,
wherein:
when Al is not present as the at least one Y group metal, a total content of the Y group metal, relative to a total content of all the metals contained in the sputtering target, is from 0.5 to 8.0 atomic %; or
when Al is present as the at least one Y group metal, a total content of the Y group metal, relative to a total content of all the metals contained in the sputtering target, is from 0.5 to 3.0 atomic %.

8. The sputtering target according to claim 7, wherein the Y group metal is at least one selected from the group consisting of Si and Ni.

* * * * *